US006965648B1

(12) United States Patent
Smith et al.

(10) Patent No.: US 6,965,648 B1
(45) Date of Patent: Nov. 15, 2005

(54) SOURCE SYNCHRONOUS LINK INTEGRITY VALIDATION

(75) Inventors: Brian L. Smith, Sunnyvale, CA (US); Prabhansu Chakrabarti, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/565,193

(22) Filed: May 4, 2000

(51) Int. Cl.⁷ .............................. H04L 5/16; H04L 25/00
(52) U.S. Cl. ........................................ 375/257; 375/220
(58) Field of Search ........................ 375/257, 219–222, 375/239, 356, 364, 360, 242, 252, 237, 287, 375/224, 225, 226, 227, 228; 702/79, 110; 370/282

(56) References Cited

U.S. PATENT DOCUMENTS

| | | | |
|---|---|---|---|
| 5,150,047 A | 9/1992 | Saito et al. | |
| 5,621,741 A | 4/1997 | Kohiyama | |
| 5,805,030 A | 9/1998 | Dhuey et al. | |
| 5,809,226 A | 9/1998 | Baldwin et al. | |
| 6,018,810 A | 1/2000 | Olarig | |
| 6,137,849 A * | 10/2000 | Humphrey | 375/354 |
| 6,336,159 B1 * | 1/2002 | MacWilliams et al. | 710/105 |
| 6,466,520 B1 * | 10/2002 | Speyer et al. | 368/118 |
| 6,505,317 B1 | 1/2003 | Smith et al. | |
| 6,553,525 B1 * | 4/2003 | Shephard, III | 714/733 |
| 6,591,319 B2 * | 7/2003 | Kurd et al. | 710/100 |
| 6,609,171 B1 * | 8/2003 | Singh et al. | 710/305 |

OTHER PUBLICATIONS

Diefendorff, "K7 Challenges Intel," Microprocessor Report, vol. 12, No. 14, Oct. 1998, 3 pgs.

Johnk, *Engineering Electromagnetic Fields and Waves*, © 1975, pp. 363-400, 541-583, 586-591.

"Aggressor Alignment for Worst-Case Coupling Noise," Chen and Marek-Sadowska, Proceedings International Symposium on Physical Design, Apr. 9, 2000, XP000922013, pp. 48-54.

"Modeling and Detection of Dynamic Errors Due to Reflection- and Crosstalk-Noise," Schrage, Proceedings of the ASP-DAC '97, IEEE, Jan. 1997, pp. 405-408.

Foreign Search Report for PCT/US 01/1447 mailed Mar. 1, 2002.

"jtag-XLi™—The Board-Level Solution; At-Speed Interconnect Test", Logic Vision.

IBM Corp., "Architecture to Facilitate Card Interconnect Self-Test," IBM Technical Disclosure Bulletin, vol. 33, No. 4, Sep. 1990, pp. 331-333.

* cited by examiner

Primary Examiner—Temesghen Ghebretinsae
Assistant Examiner—Sam K. Ahn
(74) Attorney, Agent, or Firm—Lawrence J. Merkel; Meyertons, Hood, Kivlin, Kowert & Goetzel, P.C.

(57) ABSTRACT

A system may perform interconnect BIST (IBIST) testing on source synchronous links. The system may perform, at normal operating frequency, a source synchronous link test that tests a victim line on the source synchronous link using a transition weave pattern. The transition weave pattern causes interaction between a data transition on the victim line, previous transitions on the victim line, and transitions on the other lines of the link (the "aggressor" lines). The interaction caused may be: (i) a first crossing pulse on the victim line; (ii) a second crossing pulse of the opposite polarity on each aggressor line concurrent with the first crossing pulse on the victim line; and (iii) a reflection in the opposite direction of the first transition of the first crossing pulse, wherein the reflection results from a previous transition on the victim line.

21 Claims, 7 Drawing Sheets

SOURCE SYNCHRONOUS LINK INTEGRITY VALIDATION

BACKGROUND OF THE INVENTION

1. Field of the Invention

This invention is related to the field of computer systems and, more particularly, to verifying source synchronous links within computer systems.

2. Description of the Related Art

Integrated circuits (or "chips") have included built-in self test (BIST) circuitry in order to ensure that the internal circuits of the chips are functioning properly. Generally, the BIST applies a series of test vectors to the inputs of the internal circuits and compares the outputs of the internal circuits to expected results. If the outputs differ from the expected results, then the BIST fails and the chip may include a faulty internal circuit. BIST may be run on the chip at the time of manufacture of the integrated circuit to screen out faulty parts before delivery to a customer, and may be run when the system including the chip is powered up (or at some other time as may be desired) to ensure that the chip is still functioning properly.

The interconnect between chips has typically been synchronous, and has typically not been tested using any type of BIST. In a synchronous interconnect, a single system clock is used by each of the chips connected to the synchronous interconnect to time the driving of signals on the interconnect and the sampling of signals from the interconnect. Each chip is designed to meet certain timing criteria with respect to the clock signal (e.g. setup and hold times), and these timing criteria may be tested for each chip when that chip is manufactured. However, once the chips are assembled into a system, the testing of the interconnect is typically limited to in-circuit testing (ICT) or boundary scan testing (e.g. the type of tests specified by IEEE 1149 and 1149.1). ICT and boundary scan testing is typically performed at low clock frequencies, generally significantly lower than the operating frequency of the interconnect (i.e. the frequency at which the interconnect operates when the system is running). Accordingly, ICT and/or boundary scan testing may detect faults such as broken connections in the interconnect but may be severely limited in detecting timing-related failures.

Testing the interconnect may be even more important in the source synchronous interconnects that are becoming more popular in systems. A source synchronous interconnect includes a separate clock line (or lines) for each source of data transfers and one or more data lines for each source of data transfers. The source transmits a clock signal on the clock line (or lines) and concurrently transmits data on the data lines. The data is synchronized to the clock signal. The clock signal is used by a receiver on the interconnect to sample the data on the corresponding data lines. Generally, the length of the clock line and the corresponding data lines is matched (within a permissible variation tolerance) and thus the clock and the data take approximately the same amount of time to traverse the lines. Accordingly, more than one data transfer may be outstanding on the lines at any given time. Interference between the data transfers may be a source of failure, as well as timing related failures (e.g. a data bit failing to meet setup or hold time requirements at the receiver as measured against the corresponding clock signal arriving at the receiver). Additionally, since interconnect delay may be less of a factor in source synchronous interconnects, source synchronous interconnects are often operated at even higher operating frequencies then synchronous interconnects. Furthermore, source synchronous interconnects are often operated at double data rate (transferring a data bit on a line on both the rising edge and the falling edge of the clock signal). Accordingly, the frequency of data transfers is still higher. The potential for timing-related failures is thus still further increased.

SUMMARY OF THE INVENTION

The problems outlined above are in large part solved by a system as described herein. The system may perform interconnect BIST (IBIST) testing on source synchronous links. More particularly, the system may perform, at normal operating frequency for the source synchronous link, a source synchronous link test that tests a victim line on the source synchronous link using a transition weave pattern. The transition weave pattern causes interaction between a data transition on the victim line, previous transitions on the victim line, and transitions on the other lines of the link (the "aggressor" lines). The pattern may include, for example: (i) a first crossing pulse on the victim line; (ii) a second crossing pulse of the opposite polarity on each aggressor line concurrent with the first crossing pulse on the victim line; and (iii) a reflection moving the victim line in the opposite direction of the first transition of the first crossing pulse, wherein the reflection results from a previous transition on the victim line. Generally, the first crossing pulse may provide the worst case setup and hold times on the victim line in the absence of interference from the aggressor lines. The second crossing pulse and the reflection may be used to provide interference that worsens the setup and hold times. More particularly, the reflection on the victim line may decrease the rate of the first transition of the first crossing pulse and increase the rate of the second transition of the first crossing pulse. The second crossing pulse on the aggressor lines may also serve to increase the rate of the second transition of the first crossing pulse via crosstalk coupling between the aggressor and victim lines, and via reverse simultaneous switching output (SSO) noise. Another pattern may be used to generate additional interference on the first transition of the crossing pulse, similar to the above pattern except that the second crossing pulse may be either: (i) the same polarity as the first crossing pulse and concurrent with the first crossing pulse; or (ii) the opposite polarity of the first crossing pulse but one transfer ahead of the first crossing pulse. In either case, the first transition of the first crossing pulse is concurrent with transitions of the same polarity on the aggressor lines, and thus SSO noise tends to decrease the rate of the first transition. Advantageously, source synchronous link testing may be performed at normal operating frequency.

Additionally, in one embodiment, the system may perform repeated iterations of the transition weave pattern while varying the timing of the previous transition on the victim line (to create the reflection) with respect to the first crossing pulse on the victim line. Performing the test in this fashion may approximate the "worst case" interaction of the reflection with the crossing pulses. Furthermore, performing the test in this fashion may allow for a flexible implementation of test circuitry within the system since the test may cover links of varying lengths (and thus varying reflection timings). Accordingly, test circuitry need not be customized to the particular link to be tested. Additional iterations of the test may be performed to vary the timing of the previous transition on the victim line (to create the reflection) with respect to the first crossing pulse in combination with varying the polarity of the pulse, the clock edge to which the pulse is aligned, and the line under test (the "victim line").

BRIEF DESCRIPTION OF THE DRAWINGS

Other objects and advantages of the invention will become apparent upon reading the following detailed description and upon reference to the accompanying drawings in which.

Figure 1:
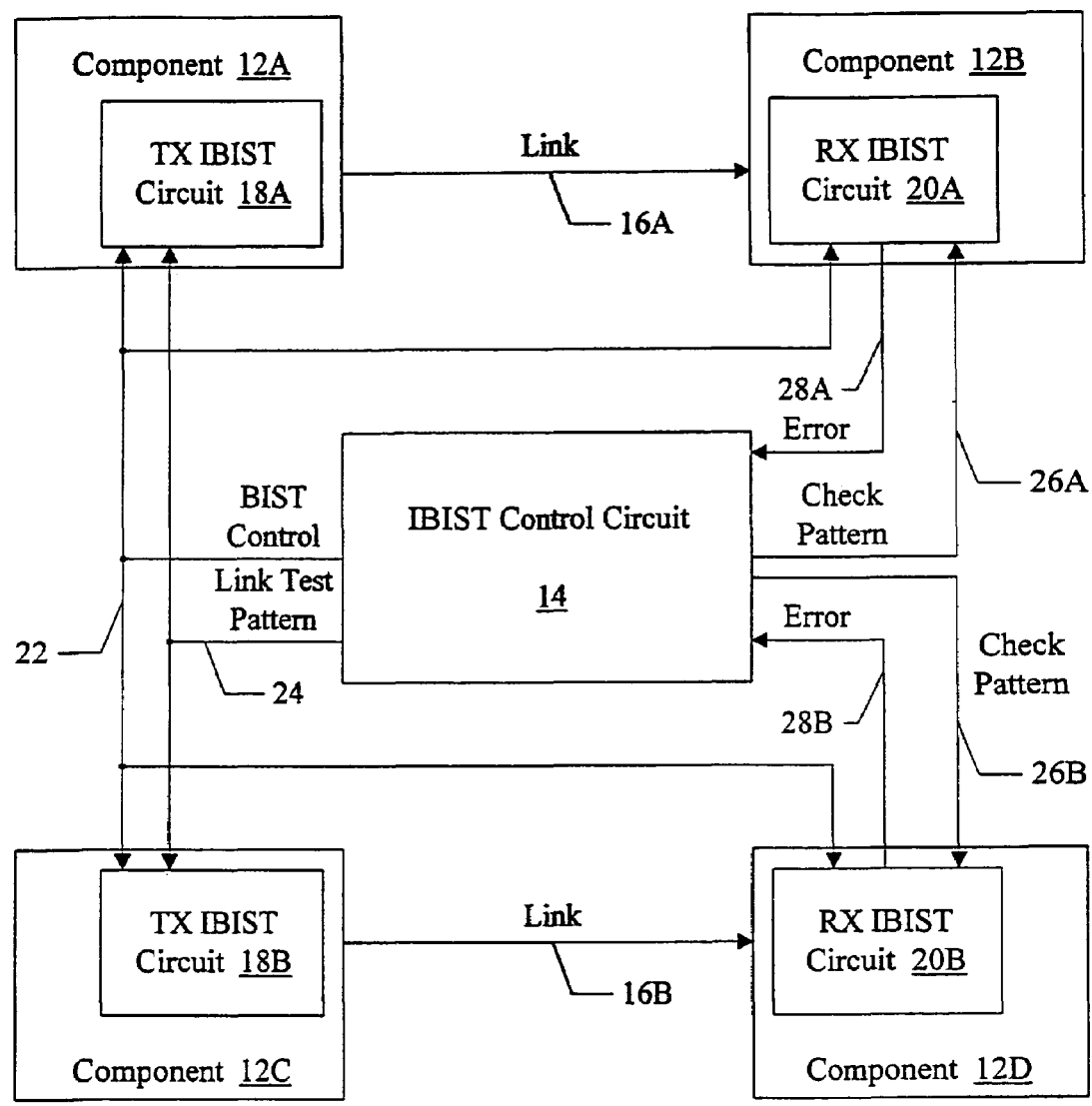
FIG. 1 is a block diagram of one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of an exemplary system 10 is shown. Other embodiments are possible and contemplated. In the embodiment shown in FIG. 1, system 10 includes a plurality of components 12A–12D and an interconnect BIST (IBIST) control circuit 14. Component 12A is coupled to component 12B via a first source synchronous link 16A, and component 12C is coupled to component 12D via a second source synchronous link 16B. Component 12A includes a transmit IBIST (TX IBIST) circuit 18A and component 12C includes a TX IBIST circuit 18B. Component 12B includes a receive IBIST (RX IBIST) circuit 20A and component 12D includes an RX IBIST circuit 20B. IBIST control circuit 14 is coupled to provide BIST control signals on lines 22 to each of circuits 18A, 18B, 20A, and 20B. Additionally, IBIST control circuit 14 is coupled to provide a link test pattern on lines 24 to TX IBIST circuits 18A–18B. IBIST control circuit 14 is coupled to provide a first check pattern on lines 26A to RX IBIST circuit 20A and a second check pattern on lines 26B to RX IBIST circuit 20B. IBIST control circuit 14 is coupled to receive error indications on lines 28A and 28B from RX IBIST circuit 20A and RX IBIST circuit 20B, respectively.

Links 16A–16B may each be a source synchronous link including at least one clock line and one or more data lines. In one particular embodiment, each of links 16A–16B may include two clock lines transmitting a differential clock signal. Other embodiments may or may not employ differential clocks, as desired. Similarly, the data lines may be differential or not differential, as desired.

To initiate IBIST, IBIST control circuit 14 uses the BIST control signals to control TX IBIST circuits 18A and 18B and RX IBIST circuits 20A and 20B. For example, the BIST control signals may include a "run IBIST" signal that activates each of circuits 18A–18B and 20A–20B to perform source synchronous link testing. Additional control signals may be included as desired.

The testing of source synchronous link 16A using TX IBIST circuit 18A and RX IBIST circuit 20A is next described. The testing of source synchronous link 16B using TX IBIST circuit 18B and RX IBIST circuit 20B may be similar. The following terms may be useful in describing the source synchronous link testing: data transfer, transition, crossing pulse, reflection, polarity. As used herein, a data transfer is a communication of a data bit on each line of the link. In one embodiment, data is transferred on each edge of the clock signal on the link, and thus two data transfers occur per clock period. Other embodiments may transfer one data bit per clock period or more than two data bits per clock period. A transition is a change from one data state on a line to the other data state on the line (e.g. from a logical high ("1"), to a logical low ("0") or from a logical low to a logical high). A crossing pulse is a first transition in one direction (low to high or high to low) for a data transfer on a line followed by a second transition in the opposite direction of the first transition on the line in the next succeeding data transfer. For a negative crossing pulse, the first transition is from high to low and the second transition is from low to high. For a positive crossing pulse, the first transition is from low to high and the second transition is from high to low. The positive crossing pulse is said to have the opposite polarity of the negative crossing pulse, and vice versa. Finally, a reflection is a signal, traveling in a first direction on a line, that results from the arrival at the end of the line of a signal traveling in the opposite direction on the line (e.g. arrival of a signal at component 12B, for signals on the lines of link 16A, may generate a reflection).

During IBIST, IBIST control circuit 14 generates link test patterns and conveys the patterns to TX IBIST circuit 18A. A link test pattern includes one or more link test vectors. Each link test vector specifies a value for each bit on link 16A to be transmitted during a particular data transfer on link 16A. A series of link test vectors are transmitted during consecutive data transfers on the link (at normal link operating frequency). TX IBIST circuit 18A causes component 12A to transmit the link test vectors on link 16A. Component 12B receives the link test vectors from link 16A. RX IBIST circuit 20A receives check vectors from IBIST control circuit 14 (that specify the expected value for each bit on link 16A for a data transfer) and checks the received link test vectors against the check vectors. If a received bit from link 16A does not match a corresponding bit from the check vector, then RX IBIST circuit 20A indicates an error to IBIST control circuit 14 via the error indication. The error indication may include a signal that an error has occurred, along with an identification of the line on the link on which the failure was detected. In one particular embodiment, the error indication may further include an indication of which of the test vectors transmitted during the clock period in which the failure was detected and on which data line the failure was detected. IBIST control circuit 14 records the error for reference by software at the conclusion of the test.

The source synchronous link test may use a transition weave pattern (illustrated in FIG. 2 below) intended to cause the worst case interaction between a data transition on one of the lines (the "victim" line), previous transitions on the victim line, and transitions on the other lines (the "aggressor" lines). More particularly, the pattern may include: (i) a first crossing pulse on the victim line; (ii) a second crossing pulse of the opposite polarity (or the same polarity, depending upon which edge of the first crossing pulse is under test) on each aggressor line concurrent with the first crossing pulse on the victim line; and (iii) a reflection moving the victim line in the opposite direction of the first transition of the first crossing pulse from a previous transition on the victim line.

In a particular implementation of system 10, link 16A could be characterized to determine the timing of the previous transition on the victim line to cause the reflection to occur concurrent with the first and second crossing pulses. However, if characterization were used to time the previous transition, TX IBIST circuit 18A and RX IBIST circuit 20A may require customization for use in each component. To avoid such customization, system 10 may employ repeated iterations of the transition weave pattern while varying the number of data transfers between the previous transition on the victim line (to create the reflection) and the first crossing pulse. In this fashion, system 10 may approximate, with the granularity of a data transfer, the worst case condition on the victim line. Furthermore, components 12A and 12B may thus be more flexible and may be included in any implementation of system 10 (which may have longer or shorter lines than link 16A has) and TX IBIST circuit 18A and RX IBIST circuit 20A may still be used to perform the source synchronous link testing.

In addition to varying the number of data transfers between the previous transition on the victim line and the first crossing pulse, other variations may be performed as well. For example, patterns that have the first crossing pulse as both a negative and a positive crossing pulse may be generated (with the second crossing pulses being positive and negative, respectively). Additionally, the clock edge on which the crossing pulse occurs may be varied between rising and falling edges. Finally, each line of link 16A may be tested as the victim line. Accordingly, the total number of data transfers for a test on a link in which the maximum number of reflection timing variations is M, the total number of victim lines is N, the total number of data transfers from assertion of a transition on a line until its reflection returns to the transmitter is P, and a data transfer is performed on each clock edge may be:

Number of data transfers=$M*N*P*2$(clock edges)*2 (pulse polarities).

As used herein, an iteration of the source synchronous link test is a set of link test vectors equal to the total number of data transfers from a transition on a line until its reflection returns to the transmitter. Each iteration includes a transition on the victim line and a crossing pulse on the victim line and on the aggressor lines.

As mentioned above, testing with respect to link 16B using TX IBIST circuit 18B and RX IBIST circuit 20B may be similar to the above description. More particularly, in the embodiment of FIG. 1, IBIST control circuit 14 may transmit the link test vectors on lines 24 to both TX IBIST circuits 18A–18B. Each TX BIST circuit 18A–18B may transmit the link test vectors on their respective links. Additionally, IBIST control circuit 14 transmits check vectors on lines 26A-26B to RX IBIST circuits 20A-20B. IBIST control circuit 14 transmits different check vectors to each of RX IBIST circuits 20A–20B to allow for different read delays in the links between the circuits. The read delay for a given link 16A–16B is the amount of time between transmitting a data transfer from the transmitting component on the link and that data transfer being received into the receiving component on the link 16A–16B. The read delay may be affected by several factors, including the length of the wires on the link and the difference in phase between the internal clocks of components 12A–12B, that are used to read the data into the components 12A–12B from receiving circuitry (e.g. a FIFO buffer) used to transfer data between clock domains. Accordingly, the time at which a given test vector arrives in components 12B and 12D may differ, and thus the time at which the check vector corresponding to that given test vector is transmitted to a particular receiving component 12B or 12D may differ as well. The read delay for a link 16A–16B may be determined through a synchronization process performed prior to the source synchronous link test. For example, a transmitter on a link may assert signals on one or more predetermined lines on a link, and the receiver may search for the asserted signals in received data transfers. When the asserted signals are received, the number of reads performed since the beginning of the synchronization may be the read delay. In one embodiment, signals are asserted on three predetermined lines and the receiver searches for asserted signals on at least two of the three predetermined lines. The read delay is programmed into a configuration register in the receiving component, and may be available to IBIST control circuit 14 for determining when to transmit the check vectors.

Each of components 12A–12D may perform a function within system 10, and may interact with other components 12A–12D to provide the operation defined for system 10. For example, each component may be a chip incorporating certain functionality and capable of communicating with other chips. The chip may be a processor (or group of processors), a peripheral interface chip, etc.

It is noted that, while two links 16A–16B are shown, IBIST control circuit 14 may be configured to perform IBIST on any number of links. Additionally, IBIST control circuit 14 may be distributed to the IBIST circuits 18 and 20, as desired. Still further, while FIG. 1 illustrates a component as being either a transmitter or a receiver on a link, components may generally be both transmitters and receivers on various links within the system. The number of links coupled to a given component may vary from component to component.

It is noted that, while links 16A–16B are source synchronous links, lines 22, 24, 26A–26B, 28A–28B may be synchronous lines. Accordingly, multiple test vectors may be concurrently transmitted on lines 24 each clock period of the clock corresponding to the synchronous lines. For example, if the clock period of the clock corresponding to the synchronous lines is the same as the clock period of the clocks on links 16A–16B, two link test vectors may be transmitted each clock period. Alternatively, lines 24 and 26A–26B may be wider than the links 16A–16B, allowing for more patterns to be sent per clock period. Similarly, two vectors of the check patterns may be concurrently transmitted on lines 26A and 26B.

It is noted that the source synchronous link testing as described herein may be used in a variety of ways. For example, the source synchronous link testing may be used to test system 10 prior to shipment to a customer. Additionally, the source synchronous link test may be used to test system 10 during use. For example, when a new component is inserted into system 10, source synchronous link testing may be used to determine that the new component is communicating properly with other components. Additionally, source synchronous link testing may be used for diagnostic or maintenance purposes during use. For example, by running source synchronous link testing with the supply voltages at the high and low limits of the permissible range (typically 5–10% above and below the nominal voltage), the links may be characterized and failing hardware may be predicted prior to an actual failure.

Figure 2:
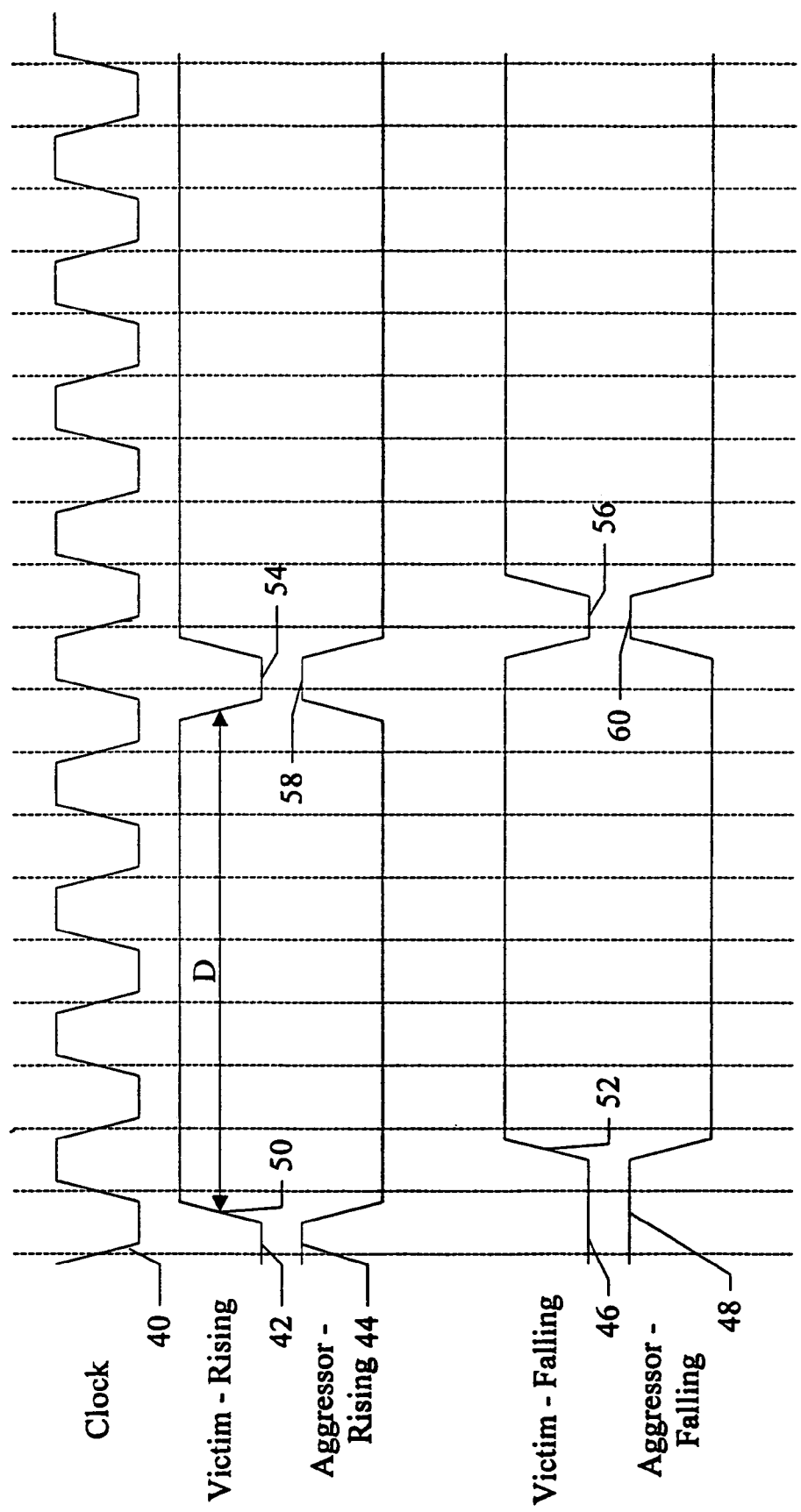
FIG. 2 is a timing diagram of exemplary victim and aggressor wave forms according to one embodiment of a source synchronous link test.

Turning now to FIG. 2, a timing diagram illustrating one embodiment of exemplary victim and aggressor wave forms according to one embodiment of the transition weave is shown. Other embodiments are possible and contemplated. Illustrated in FIG. 2 are a clock signal 40, a victim signal 42 having a crossing pulse on the rising edge of the clock signal 40, an aggressor signal 44 corresponding to victim signal 42, a victim signal 46 having a crossing pulse on the falling edge of the clock signal 40, and an aggressor signal 48 corresponding to victim signal 46. For the embodiment illustrated in FIG. 2, a data transfer occurs on each edge of clock signal 40 (rising and falling). Data transfer points are indicated via vertical dashed lines in FIG. 2.

Victim signals 42 and 46 are signals that may be applied to the victim line during source synchronous link testing, and aggressor signals 44 and 48 are corresponding signals (respectively) that may be applied to each of the aggressor lines concurrent with the respective victim signals 42 and 46 being applied to the victim line. Accordingly, a link test vector for a given data transfer may include the victim line having a value according to the victim signals 42 or 46 and each of the aggressor lines having a value according to the corresponding aggressor signals 44 or 48 (respectively).

Victim signals 42 and 46 each include a first transition (reference numerals 50 and 52) used to cause a reflection on the victim line, as well as a crossing pulse (reference numerals 54 and 56). Thus, victim signal 42 (and aggressor signal 44) may form an iteration of the source synchronous link test and victim signal 46 (and aggressor signal 44) may form another iteration of the source synchronous link test. Aggressor signal 44 includes a crossing pulse 58 having the opposite polarity of crossing pulse 54 and occurring during the same data transfer as crossing pulse 54. Similarly, aggressor signal 48 includes a crossing pulse 60 having the opposite polarity of crossing pulse 56 and occurring during the same data transfer as crossing pulse 56. The first transition creates a reflection that may interfere with the later occurring crossing pulse. For example, the first transition 50 on victim signal 42 may cause a rising reflection (tending towards a logical high on the victim line) that may interfere with the negative crossing pulse 54.

As illustrated on victim signal 42, a number of data transfers (D) separates the first transition and the crossing pulse. As mentioned above, the number of data transfers between the first transition and the crossing pulse may be varied to attempt to cause the worst case interaction of the reflection and the crossing pulse. Accordingly, the iterations shown in FIG. 2 may be iteratively applied to the victim and aggressor lines with the number of data transfers between the first transition and the crossing pulse varied from 0 up to the largest number of data transfers that may occur between the first transition and the crossing pulse within the reflection time period. For example, in an embodiment in which 16 data transfers may occur between the first transition and the corresponding reflection returning to the transmitter, the largest number of data transfers that may occur between the first transition and the crossing pulse is 14 (since the crossing pulse uses 2 data transfers).

In the embodiment shown, crossing pulses 54 and 56 are negative crossing pulses and crossing pulses 58 and 60 are positive crossing pulses. In order to test positive crossing pulses on the victim lines, victim signals similar to aggressor signals 44 and 48 may be applied to the victim line and aggressor signals similar to victim signals 42 and 46 (respectively) may be applied to the aggressor lines.

It is noted that aggressor signals 44 and 48 include a transition during the same data transfer as first transition 50 and first transition 52 (respectively). The transition on aggressor signals 44 and 48 is in the opposite direction of the first transition 50 or 52. Other embodiments may eliminate this transition, if desired.

Figure 3:
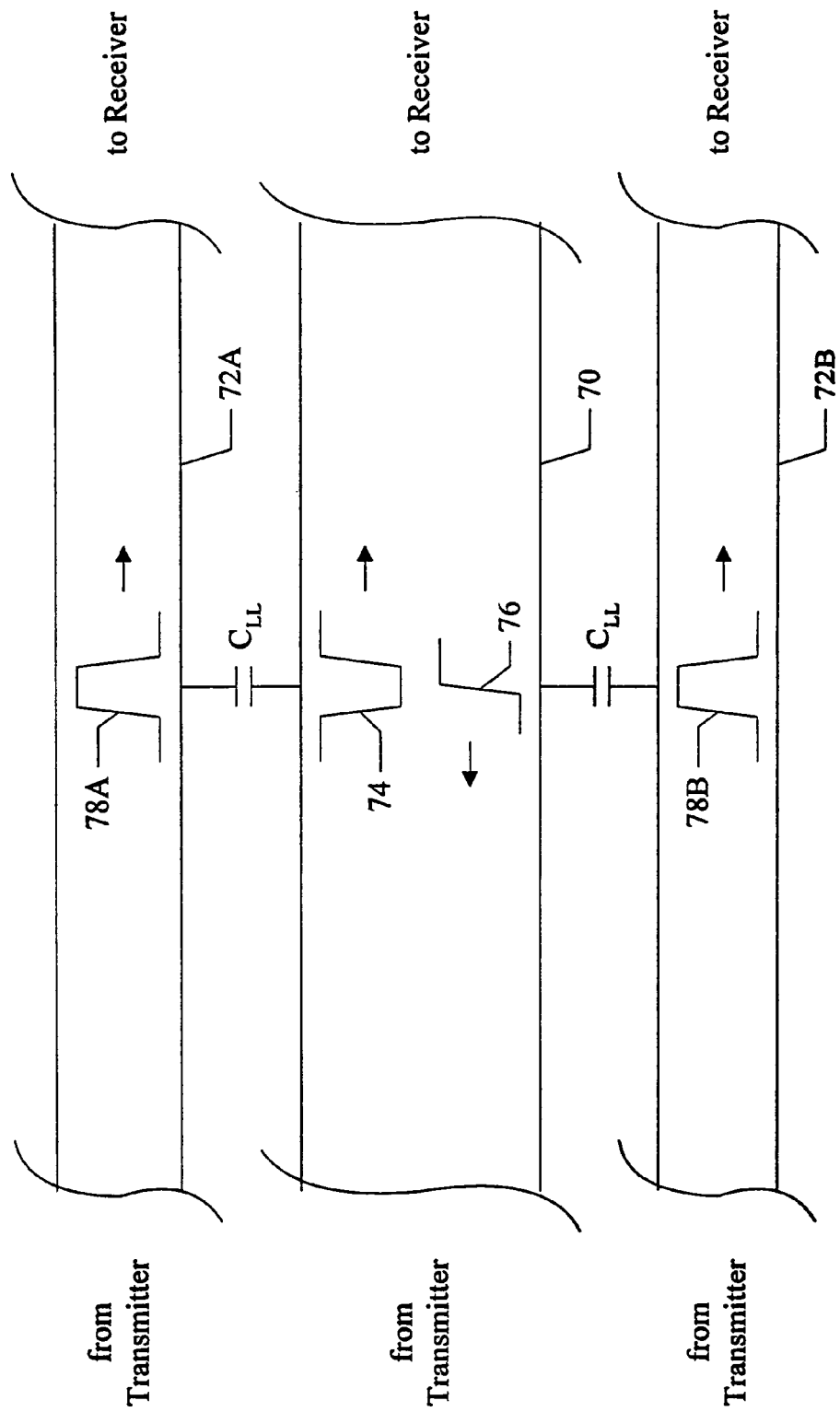
FIG. 3 is a diagram illustrating crossing pulses and reflections on a set of adjacent lines of a source synchronous link.

Turning next to FIG. 3, a block diagram illustrating a victim line 70 and a pair of adjacent aggressor lines 72A and 72B is shown. FIG. 3 illustrates a negative crossing pulse 74 and a reflection 76 on the victim line 70, and a positive crossing pulses 78A–78B on aggressor lines 72A–72B, respectively.

The point in time illustrated in FIG. 3 is the time at which the negative crossing pulse 74 (travelling from the transmitter to the receiver on victim line 70) arrives at the same point on victim line 70 as the reflection 76 (travelling from the receiver to the transmitter). At this point in time, the reflection 76 and the negative crossing pulse 74 may add to produce a smaller negative crossing pulse (since the reflection 76 interferes with the negative crossing pulse 74). Additionally, the positive crossing pulses 78A–78B on aggressor lines 72A–72B may continue to interfere with the negative crossing pulse 74 via the cross coupling that exists between victim line 70 and aggressor lines 72A–72B (e.g. capacitive cross coupling is illustrated in FIG. 3 as the capacitance $C_{LL}$, although the cross coupling may be inductive as well). Accordingly, with the reflection 76 and the positive crossing pulses 78A–78B all interfering with the negative crossing pulse 74 at the same time, the "worst case" interference with the negative crossing pulse may be occurring. If the negative crossing pulse is still sampled as a negative crossing pulse by the receiver in the face of the interference, then the test may pass.

More particularly, as mentioned above, the negative crossing pulse 74 provides the worst case setup and hold times on the victim line (in the absence of the interference from the reflection 76 and the positive crossing pulses 78A-78B). The rising reflection 76 may speed the second transition of the negative crossing pulse 74, worsening the hold time for the negative crossing pulse 74. Also, the rising reflection may slow the first transition of the negative crossing pulse 74, worsening the setup time for the negative crossing pulse 74. The positive crossing pulses 78A–78B interfere with the negative crossing pulse 74 in at least two ways as well. First, the positive crossing pulses tend to move the victim line 70 in the same direction as the second transition of negative crossing pulse 74 via crosstalk, speeding the second transition of the negative crossing pulse 74 and slowing the first transition of the negative crossing pulse 74. Furthermore, the positive crossing pulses 78A–78B may cause an additional interference for negative crossing pulse 74 via the effects of reverse SSO. Since the aggressor lines are switching in the opposite direction of the victim line, the SSO noise that operates to slow the second transition of the positive crossing pulses 78A–78B also operates to speed the second transition of negative crossing pulse 74.

It is noted that, while the reflection illustrated in FIG. 3 is moving from the receiver to the transmitter, the reflection may be traveling in either direction to create the interference.

Figure 8:
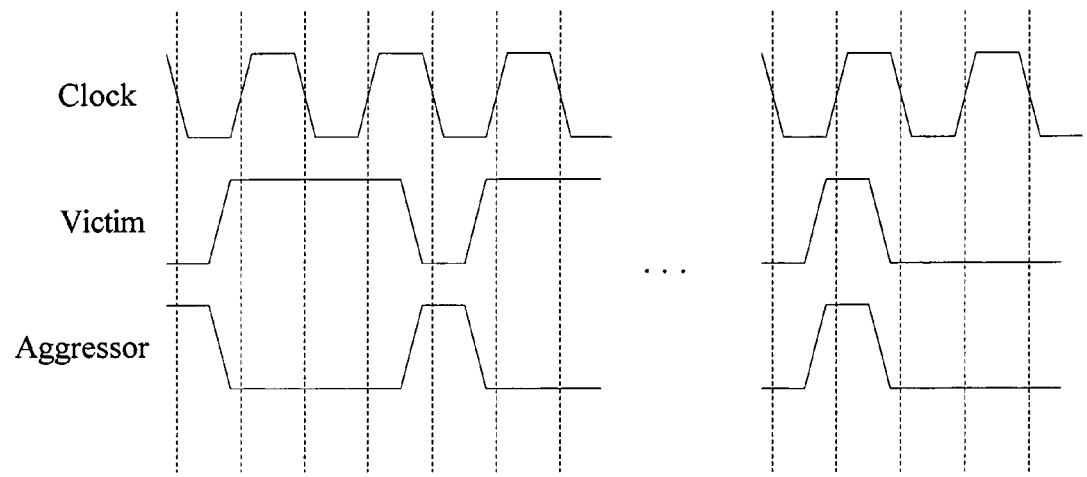
FIG. 8 is a timing diagram of exemplary victim and aggressor wave forms illustrating concurrent crossing pulses of the same polarity.
Figure 9:
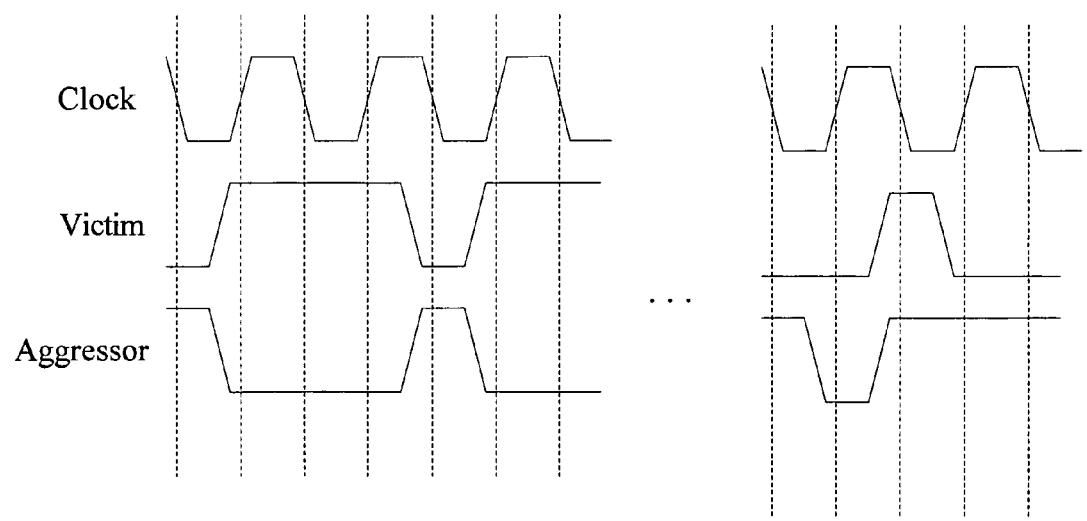
FIG. 9 is a timing diagram of exemplary victim and aggressor wave forms, illustrating a crossing pulse on the aggressor wave form one data transfer prior to a crossing pulse on the victim wave form of the opposite polarity.

While the effects of reverse SSO speed the second transition of the negative crossing pulse 74 and thus worsen the hold time on the victim line 70, speeding the first transition of the negative crossing pulse 74 does not worsen the setup time. Thus, an additional pattern may be generated that provides crossing pulses on the aggressor lines that have the same polarity as the crossing pulse on the victim line and are concurrent with the crossing pulse on the victim line. These patterns use the effect of SSO noise to slow the transitions of the crossing pulse on the victim line (since the aggressor lines are switching in the same direction as the victim line in this case) and thus slow the first transition of the crossing pulse on the victim line. FIG. 8 is a timing diagram illustrating an exemplary victim crossing pulse and an exemplary concurrent aggressor crossing pulse of the same polarity. Additionally shown in FIG. 8 is a transition on the victim line and concurrent crossing pulses of opposite polarities, occurring prior to the exemplary victim crossing pulse and the exemplary concurrent aggressor crossing pulse of the same polarity. Alternatively, the aggressor lines may carry a crossing pulse of the opposite polarity that occurs one data transfer ahead of the crossing pulse on the victim line. In this manner, the second transition of the aggressor crossing pulses occur during the same data transfer as the first transition of the victim crossing pulse. Since these transitions are of the same polarity, SSO effects again tend to slow the first transition of the crossing pulse on the victim line. FIG. 9 is a timing diagram illustrating an exemplary victim crossing pulse and an exemplary aggressor crossing pulse of the opposite polarity occurring one data transfer ahead of the victim crossing pulse. Additionally shown in FIG. 9 is a transition on the victim line and concurrent crossing pulses of opposite polarities, occurring prior to the exemplary victim crossing pulse and the exemplary concurrent aggressor crossing pulse of the opposite polarity occurring one data transfer ahead of the victim crossing pulse.

Figure 4:
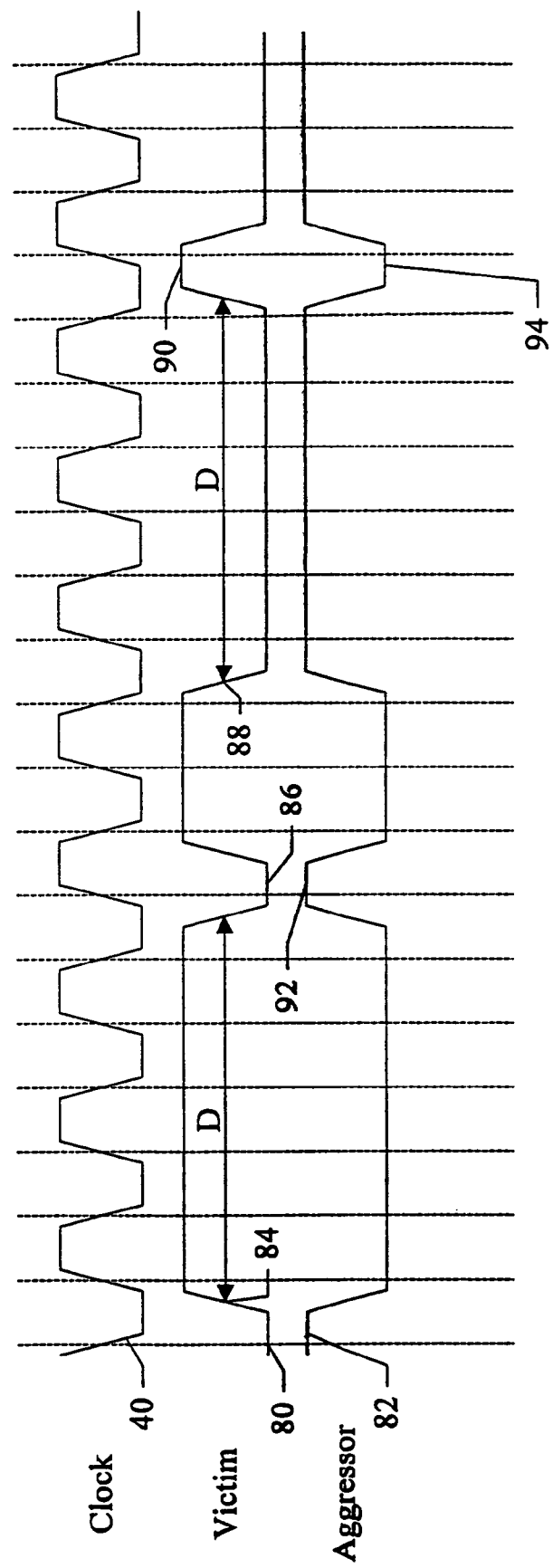
FIG. 4 is a timing diagram illustrating two wave forms within one embodiment of the source synchronous link test.

Turning next to FIG. 4, a timing diagram of clock signal 40, a victim signal 80, and an aggressor signal 82 according to one embodiment of the source synchronous link test. Other embodiments are possible and contemplated. Victim signal 80 and aggressor signal 82 may be used to perform the source synchronous link test without generating transitions on the lines that are not part of the test.

Victim signal 80 includes a first transition 84, a negative crossing pulse 86, a second transition 88, and a positive crossing pulse 90. First transition 84 is separated from negative crossing pulse 86 by D data transfers, and second transition 88 is separated from positive crossing pulse 90 by D data transfers as well. Accordingly, victim signal 80 performs both polarities of the crossing pulse test for a particular clock edge and number of data transfers between the pulse and the transition that creates the reflection. In other words, victim signal 80 (and aggressor signal 82) may form two iterations of the source synchronous link test. Aggressor signal 82 includes a positive crossing pulse 92 in the same data transfer as negative crossing pulse 86 and a negative crossing pulse 94 in the same data transfer as positive crossing pulse 90.

Victim signal 80 and aggressor signal 82 may be iteratively generated with the crossing pulses on the other clock edge and by varying the number of data transfers between the transition creating the reflection and the crossing pulses to complete the test for a particular victim line. For each iteration, the crossing pulses on aggressor signal 82 remain aligned in the same data transfer with the crossing pulses of victim signal 80, as illustrated in FIG. 4. The set of victim signals and aggressor signals thus generated may then be repeated with each line as the victim line to test each line. Each iteration of victim signal 80 and aggressor signal 82 may be two iterations of the source synchronous link test.

It is noted that the number of data transfers illustrated in FIGS. 2 and 4 are exemplary only. As mentioned above, an iteration of the source synchronous link test is a set of link test vectors equal to the total number of data transfers from a transition on a line until its reflection returns to the transmitter.

Figure 5:
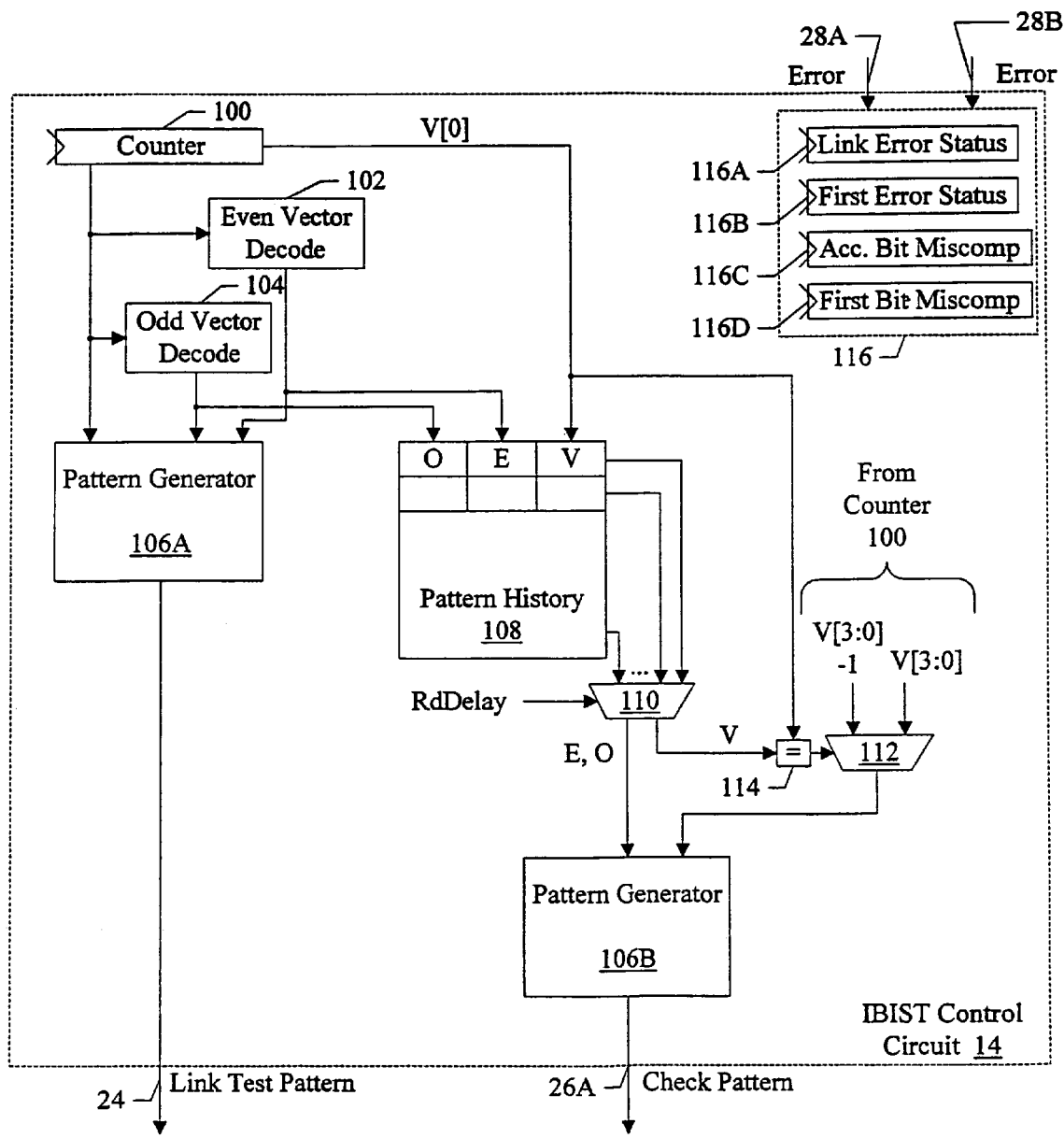
FIG. 5 is a block diagram of one embodiment of an IBIST control circuit shown in FIG. 1.

Turning next to FIG. 5, a block diagram of a portion of one embodiment of IBIST control circuit 14 is shown. Other embodiments are possible and contemplated. In the embodiment of FIG. 5, IBIST control circuit 14 includes a counter 100, an even vector decode circuit 102, an odd vector decode circuit 104, a pair of pattern generators 106A and 106B, a pattern history buffer 108, a pattern history mux 110, a victim mux 112, a comparator 114, and a set of status registers 116. Status registers 116 include a link error status register 116A, a first error status register 116B, an accumulated bit miscompare register 116C, and a first bit miscompare register 116D. Counter 100 is coupled to even vector decode circuit 102, odd vector decode circuit 104, pattern generator 106A, pattern history buffer 108, comparator 114, and victim mux 112. Even vector decode circuit 102 and odd vector decode circuit 104 are each coupled to pattern generator 106A and pattern history buffer 108. Pattern history buffer 108 is coupled to pattern history mux 110, which is further coupled to comparator 114 and pattern generator 106B. Pattern generator 106A is further coupled to lines 24. Comparator 114 is coupled to victim mux 112, which is further coupled to pattern generator 106B, which is still further coupled to lines 26A. Status registers 116 are coupled to receive lines 28A and 28B.

Figure 6:
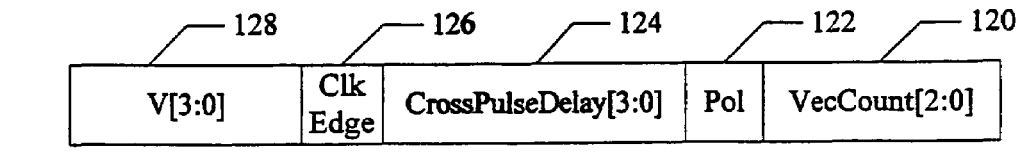
FIG. 6 is a block diagram of one embodiment of a counter register shown in FIG. 5.

Counter 100 is incremented each clock cycle, and is used to sequence through the pattern generation for generation of the link test vectors on lines 24 and the check vectors on lines 26A. For one embodiment, the fields of counter 100 are illustrated in FIG. 6. In FIG. 6, the fields are illustrated with the least significant bit on the right side. Fields that are multi-bit include a bit count in square brackets, and other fields may be a single bit. A VecCount field 120 tracks the vector count within the current iteration of the source synchronous link test. Since there are two data transfers per clock cycle in the present embodiment, the vector count is actually a count of pairs of vectors (one transferred on the rising edge of the clock signal, designated the odd vector, and one transferred on the falling edge of the clock signal, designated the even vector). The polarity field 122 tracks which polarity of the crossing pulse is being tested in the current iteration (negative or positive). The crossing pulse delay field 124 tracks which crossing pulse delay (from the transition that creates the reflection on the victim line) is being tested in the current iteration. The clock edge field 126 tracks which clock edge (rising or falling) the crossing pulse is aligned to in the current iteration. Finally, the victim field 128 tracks which of the data lines of the link is being tested as the victim line in the current iteration.

Since counter 100 is incremented to sequence through the pattern generation, the counter 100 as illustrated in FIG. 6 generates vectors in the following order: vectors of one iteration of the source synchronous link are generated (as the vector count field is incremented), then the opposite polarity of the crossing pulse is tested in the next iteration using the same delay and clock edge, then the crossing pulse delay is varied for iterations of both polarities, then the clock edge is changed for iterations of each polarity and crossing pulse delay, and finally the victim line is changed. Since the polarity is changed first, victim and aggressor signals similar to those shown in FIG. 4 may be generated by this embodiment (two iterations that are iterated for crossing pulse delay, clock edge, and victim line).

As mentioned above, IBIST control circuit 14 may generate an additional link test pattern and check pattern each clock cycle and the links may transmit data on each clock edge of the clock associated with the link, in the present embodiment. Accordingly, pattern generators 106A–106B generate a test vector for each edge of the clock cycle and transmit the two vectors as a link test pattern for the present embodiment. The transmit IBIST circuits transmit the first of the two vectors of the falling edge on the clock signal, and the second of the two vectors on the rising edge of the clock signal.

Even vector decode circuit 102 and odd vector decode circuit 104 generate even and odd signals that may be used to generate the test vector for the rising edge (odd) and falling edge (even) of the current clock cycle. The following formulas may represent the operation of even and odd decode circuits 102 and 104 using the fields of counter register 100 as shown in FIG. 6. In the formulas, a "~" refers to inversion; a "==" refers to comparison; and "&" refers to logical AND; a "|" refers to logical OR; and a "^" refers to logical XOR.

EvenVec=~(((VecCount[2:0]==CrossPulseDelay[3:1])
&~CrossPulseDelay[0]) | ((VecCount[2:0]
==3'b000')&ClkEdge))^Pol OddVec=~((VecCount[2:0]===CrossPulseDelay[3:1])
&CrossPulseDelay[0])^Pol The comparison between the vector count and the cross pulse delay determines if the current clock cycle includes the test vector in which the crossing pulse is to be generated. The second term in each equation (ANDing with either bit zero of the crossing pulse delay or the inversion thereof) selects the even or odd test vector within the current clock cycle for generation of the crossing pulse. The XOR with the polarity is used to reverse the polarity if the Pol bit is set. Finally, the EvenVec equation includes a comparison of the VecCount to zero to generate the transition that generates the reflection. Thus, in this embodiment, the transition is fixed in the first test vector of an iteration and the crossing pulse is moved about within the iteration to vary the number of data transfers between the transition and the crossing pulse.

Figure 7:
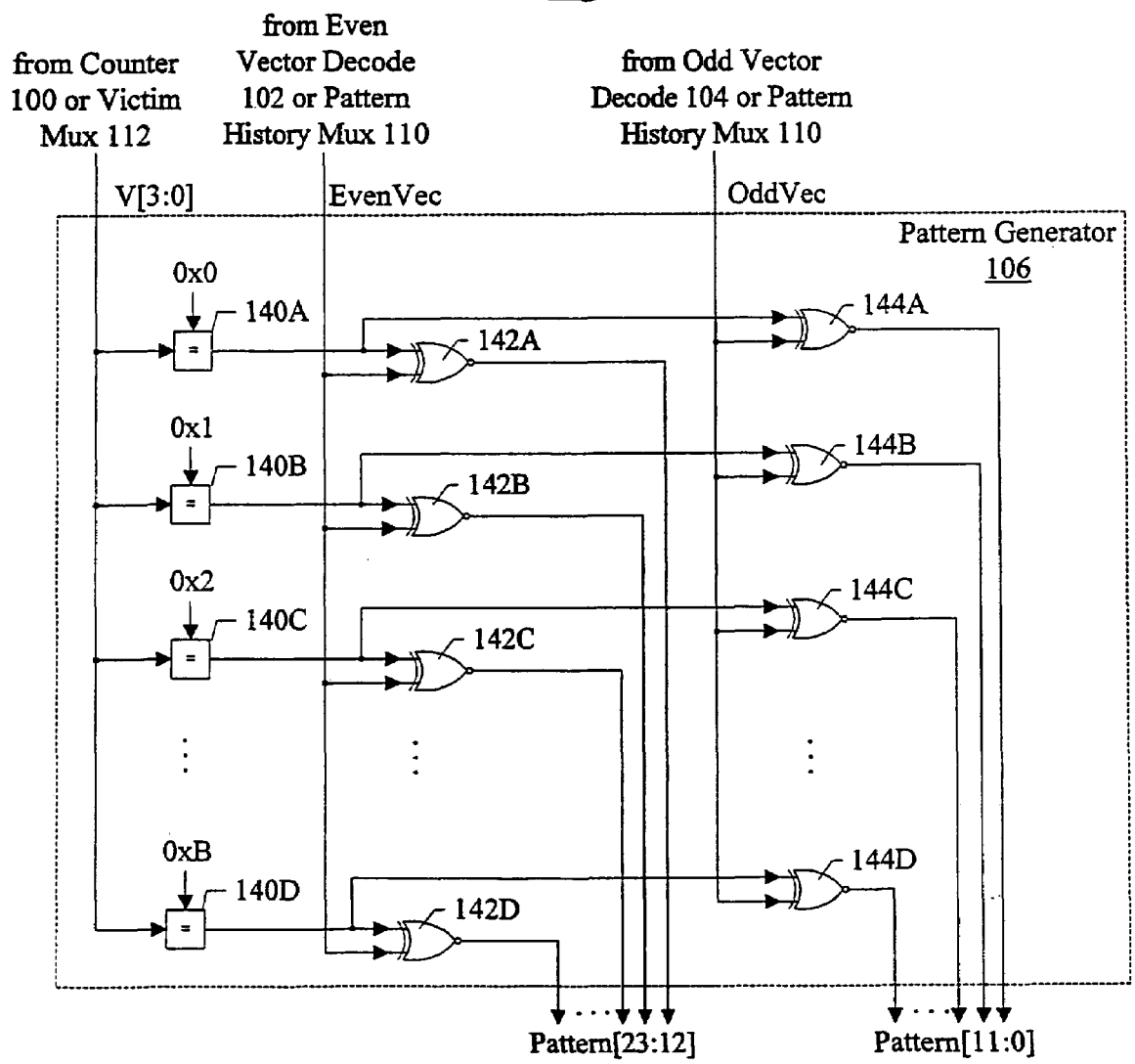
FIG. 7 is a block diagram of one embodiment of a pattern generator shown in FIG.

Pattern Generator 106A generates the link test pattern for the current clock cycle according to the EvenVec and OddVec signals above and the current victim line from victim field 128 of counter 100. Exemplary logic circuitry for pattern generators 106A and 106B is shown in FIG. 7 below.

The EvenVec and OddVec signals used to generate a link test pattern and bit zero of the victim line under test (V[0]) are saved for each link test pattern in pattern history buffer 108. In the embodiment shown, pattern history buffer 108 may be a shift register, wherein each entry in the shift register stores the EvenVec, OddVec, and V[0]. As link test patterns are generated, the EvenVec, OddVec, and V[0] are shifted into the shift register.

The read delay (in clock cycles) corresponding to link 16A may be used as a selection control on pattern history mux 110 to select one of the entries in pattern history buffer 108. In this fashion, the generation of a check pattern corresponding to a link test pattern may be delayed until the entry corresponding to that link test pattern is shifted to the selected entry. Accordingly, the check pattern may be provided to RX IBIST circuit 20A timed to the arrival of the corresponding link test pattern at RX IBIST circuit 20A.

The EvenVec and OddVec values from the selected entry are provided to pattern generator 106B for generation of a check pattern. The V[0] bit from the selected entry is provided to comparator 114, which also receives the V[0] bit currently in counter register 100. Since the victim field is stored in the most significant bits of counter 100, the read delay may be less than the number of clock cycles required for the victim field to change twice prior to generation of a check pattern corresponding to a particular link test pattern. Thus, the victim field may change at most once between the generation of a link test pattern and the corresponding generation of a check pattern. Therefore, the least significant bit of the victim field (V[0]) may be recorded in the pattern history buffer entry and may be compared to the least significant bit of the victim field during the clock cycle that the check pattern is generated to determine the victim line for the check pattern. Accordingly, if the current V[0] bit in counter 100 differs from the V[0] bit stored in the selected entry (as determined by comparator 114), the current victim line under test (V[3:0]) minus one is selected through victim mux 112. Otherwise, the current victim line under test is selected through victim mux 112. The output of victim mux 112 is provided as the victim line number to pattern generator 106B. Pattern generator 106B generates a check pattern in response to the EvenVec, OddVec, and victim line values.

IBIST control circuit 14 is configured to record source synchronous link test results in status registers 116 as well. IBIST control circuit 14 receives the error indications from each RX IBIST circuit (e.g. lines 28A from RX IBIST circuit 20A and lines 28B from RX IBIST circuit 20B). IBIST control circuit 14 may record at least which links detected errors during the source synchronous link test, which bits on any links had errors, and the first link (and first bit on the first link) for which an error was detected. Link error status register 116A includes a bit for each link, and the bit may be set if an error was detected on that link during the source synchronous link test. Similarly, first error status register 116B may include a bit for each link, and the bit corresponding to the first link to detect an error during the source synchronous link may be set. Accumulated bit miscompare register 116C may include a bit for each bit on a link, and the bits corresponding to bits for which an error was detected on any link during the source synchronous link test may be set. Similarly, first bit miscompare register 116D may include a bit for each bit on a link, and may record the first bit on the first link for which an error is detected during the source synchronous link test. In one particular embodiment, accumulated bit miscompare register 116C and first bit miscompare register 116D may include two bits for each bit on the link. One bit may correspond to the odd test vector and the other bit may correspond to the even test vector. The error indications provided by the RX IBIST circuits may include an identification of which test vector (even or odd) during the clock cycle for which the bit was in error, and the corresponding error bit may be set.

It is noted that FIG. 5 shows circuitry for generating check patterns for RX IBIST circuit 20A. Other links may have different read delays. Thus, pattern history mux 110, comparator 114, victim mux 112, and pattern generator 106B may be repeated for each other link tested by IBIST control circuit 14. Pattern history mux 110 may include the read delay corresponding to each other link as select controls in the various repeated copies.

Turning next to FIG. 7, an exemplary pattern generator 106 that may be used as pattern generator 106A and/or pattern generator 106B is shown. Other embodiments are possible and contemplated. In the embodiment of FIG. 7, pattern generator 106 includes a set of comparators 140A–140D, a first set of XNOR gates 142A–142D, and a second set of XNOR gates 144A–144D. Each of comparators 140A–140D are coupled to receive the victim field 128 from counter 100 (or victim mux 112). Each of comparators 140A–140D is further coupled to a corresponding XNOR gate 142A–142D and 144A–144D. Each of XNOR gates 142–142D is coupled to receive the EvenVec from even vector decode circuit 102 (or pattern history mux 110) and is coupled to provide an output bit to the even test vector (Pattern[23:12] in FIG. 7). Similarly, each of XNOR gates 142A–142D is coupled to receive the OddVec from odd vector decode circuit 104 (or pattern history mux 110) and is coupled to provide an output bit to the odd test vector (Pattern[11:0] in FIG. 7).

Generally, each test vector specifies the value on each line for a data transfer (the even test vector for the even data transfer of the clock cycle and the odd test vector for the odd data transfer of the clock cycle). Furthermore, one victim line is set to a particular data state (high or low) and each of the aggressor lines is set to the opposite state. Comparator circuits 140A–140D (and other comparator circuits not shown), XNOR circuits 142A–142D (and other XNOR circuits not shown), and XNOR circuits 144A–144D (and other XNOR circuits not shown) produce these test vectors.

More particularly, pattern generator circuit 106 may include one comparator 140, one XNOR gate 142, and one XNOR gate 144 for each line on the link. The comparator compares the victim field to the line number corresponding to that comparator. Thus, one comparator may have an asserted output signal and each of the other comparator may have a deasserted output signal for any give value of the victim field. The output signal is passed to the XNOR gate 142 and XNOR gate 144 for that line, where the output signal is XNOR'd with the EvenVec and OddVec signals (respectively). The XNOR gate with the asserted output signal will thus have the opposite value (high or low) than the other XNOR gates within the same set, and is the victim line under test. The EvenVec and OddVec signals select the polarity of the victim bit and aggressor bits for the even and odd test vectors, respectively.

It is noted that, while a specific logic circuit is shown in FIG. 7 (and specific logical equations for the EvenVec and OddVec signals are shown above), any other suitable logic circuits/equations may be used (including Boolean equivalents of those shown).

Numerous variations and modifications will become apparent to those skilled in the art once the above disclosure is fully appreciated. It is intended that the following claims be interpreted to embrace all such variations and modifications.

What is claimed is:

1. A method comprising:
generating a first transition on a first line of a source synchronous link to cause a first reflection on said first line;
subsequently generating a first crossing pulse on said first line and generating a second crossing pulse on a second line of said source synchronous link, said generating said second crossing pulse performed concurrent with said generating said first crossing pulse, said second crossing pulse having an opposite polarity of said first crossing pulse;
receiving said first crossing pulse and said second crossing pulse in a receiving circuit coupled to said first line and to said second line
generating a third crossing pulse on said first line;
generating a fourth crossing pulse on said second line, said generating said fourth crossing pulse performed concurrent with said generating said third crossing pulse, said fourth crossing pulse having a same polarity as said third crossing pulse; and
verifying that signals on said first line and said second line are correctly received in said receiving circuit.

2. The method as recited in claim 1 wherein said source synchronous link includes one or more additional lines, the method further comprising generating a fifth crossing pulse on each of said one or more additional lines concurrently with said generating said first crossing pulse and said generating said second crossing pulse, said fifth crossing pulse having said opposite polarity of said first crossing pulse.

3. The method as recited in claim 1 wherein said first transition occurs from a first binary state to a second binary state on said first line.

4. The method as recited in claim 3 wherein said generating said first crossing pulse comprises generating a transition from said second binary state to said first binary state and subsequently generating a transition from said second binary state to said first binary state.

5. The method as recited in claim 1 further comprising:
generating a second transition on said first line to cause a second reflection on said first line subsequent to said generating said first crossing pulse; and
subsequently generating a fifth crossing pulse on said first line, wherein said fifth crossing pulse has said opposite polarity of said first crossing pulse.

6. The method as recited in claim 5 further comprising generating a sixth crossing pulse on said second line, said generating said sixth crossing pulse performed concurrent with said generating said fifth crossing pulse, and said sixth crossing pulse having an opposite polarity of said fifth crossing pulse.

7. The method as recited in claim 1 wherein said source synchronous link includes a clock line, and wherein a transfer on said source synchronous link occurs on each edge of said clock signal, and wherein said first crossing pulse occurs on a first one of a rising edge or a falling edge of said clock signal, the method further comprising:
generating a fifth crossing pulse on said first line on the other one of said rising edge or said falling edge of said clock signal; and
generating a sixth crossing pulse on said second line concurrent with said generating said fifth crossing pulse.

8. The method as recited in claim 1 further comprising:
generating a second transition on said second line to cause a second reflection on said second line subsequent to said generating said first crossing pulse; and
subsequently generating a fifth crossing pulse on said second line and generating a sixth crossing pulse on said first line, said generating said sixth crossing pulse performed concurrent with said generating said fifth crossing pulse, said sixth crossing pulse having an opposite polarity of said fifth crossing pulse.

9. The method as recited in claim 1 further comprising:
generating a fifth crossing pulse on said first line; and
generating a sixth crossing pulse on said second line, said generating said sixth crossing pulse performed one data transfer prior to said generating said fifth crossing pulse, said sixth crossing pulse having an opposite polarity of said fifth crossing pulse.

10. A method comprising:
generating a first transition on a first line of a source synchronous link to cause a first reflection on said first line;
subsequently generating a first crossing pulse on said first line and generating a second crossing pulse on a second line of said source synchronous link, said generating said second crossing pulse performed concurrent with said generating said first crossing pulse, said second crossing pulse having an opposite polarity of said first crossing pulse;
receiving said first crossing pulse and said second crossing pulse in a receiving circuit coupled to said first line and to said second line;
generating a second transition on said first line to cause a second reflection on said first line subsequent to said generating said first crossing pulse;
subsequently generating a third crossing pulse on said first line, wherein a first number of data transfers on said first line between said first reflection and said first crossing pulse differs from a second number of data transfers on said first line between said second reflection and said third crossing pulse; and
verifying that signals on said first line and said second line are correctly received in said receiving circuit.

11. The method as recited in claim 10 further comprising generating a fourth crossing pulse on said second line, said generating said fourth crossing pulse performed concurrent with said generating said third crossing pulse, and said fourth crossing pulse having an opposite polarity of said third crossing pulse.

12. A system comprising:
a source synchronous link including at least a first line and a second line;
a first circuit coupled to transmit on said source synchronous link;
a second circuit coupled to receive on said source synchronous link;
wherein said first circuit is configured to transmit a first transition for generating a first reflection on said first line and to transmit a subsequent first crossing pulse on said first line, and wherein said first circuit is configured to transmit a second crossing pulse on said second line, said second crossing pulse transmitted concurrent with said first crossing pulse and having an opposite polarity of said first crossing pulse, and wherein said second circuit is configured to verify that signals on said first line and said second line are correctly received;
a second source synchronous link including at least a third line and a fourth line;
a third circuit coupled to transmit on said second source synchronous link;
a fourth circuit coupled to receive on said second source synchronous link; and
wherein said third circuit is configured to transmit a second transition for generating a second reflection on said third line and to transmit a subsequent third crossing pulse on said first line, and wherein said third circuit is configured to transmit a fourth crossing pulse on said fourth line, said fourth crossing pulse transmitted concurrent with said third crossing pulse and having an opposite polarity of said third crossing pulse, and wherein said fourth circuit is configured to receive said fourth crossing pulse and to verify that said fourth crossing pulse is correctly received.

13. The system as recited in claim 12 wherein said source synchronous link includes one or more additional lines, and wherein said first circuit is configured to transmit a fifth crossing pulse on each of said one or more additional lines concurrent with said first crossing pulse on said first line and said second crossing pulse on said second line, said fifth crossing pulse having said opposite polarity of said first crossing pulse.

14. The system as recited in claim 12 wherein said first circuit is further configured to transmit a third transition to cause a third reflection on said first line subsequent to said first crossing pulse, and wherein said first circuit is further configured to subsequently transmit a fifth crossing pulse on said first line, wherein said fifth crossing pulse has said opposite polarity of said first crossing pulse.

15. The system as recited in claim 14 wherein said first circuit is further configured to transmit a sixth crossing pulse on said second line concurrent with said fifth crossing pulse, and said sixth crossing pulse having an opposite polarity of said fifth crossing pulse.

16. The system method as recited in claim 12 wherein said source synchronous link includes a clock line, and wherein a transfer on said source synchronous link occurs on each edge of said clock signal, and wherein said first crossing pulse occurs on a first one of a rising edge or a falling edge of said clock signal, and wherein said first circuit is further configured to transmit a fifth crossing pulse on said first line on the other one of said rising edge or said falling edge of said clock signal, and wherein said first circuit is further configured to transmit a sixth crossing pulse on said second line concurrent with said fifth crossing pulse.

17. The system as recited in claim 12 wherein said first circuit is further configured to transmit a third transition on said second line to generate a third reflection subsequent to said generating said first crossing pulse, and wherein said first circuit is further configured to transmit a fifth crossing pulse on said second line and a sixth crossing pulse on said first line, said sixth crossing pulse transmitted concurrent with said fifth crossing pulse, said sixth crossing pulse having an opposite polarity of said fifth crossing pulse.

18. The system as recited in claim 12 further comprising one or more error registers, wherein said second circuit is configured to report an error if said first crossing pulse is not correctly received in said second circuit, and wherein said error is logged in said one or more error registers.

19. The system as recited in claim 12 wherein the first circuit is further configured to transmit a fifth crossing pulse on said first line and to concurrently transmit a sixth crossing pulse on said second line, said sixth crossing pulse having a same polarity as said fifth crossing pulse.

20. The system as recited in claim 12 wherein the first circuit is further configured to transmit a fifth crossing pulse on said first line and to transmit a sixth crossing pulse on said second line one data transfer prior to transmitting said fifth crossing pulse, said sixth crossing pulse having an opposite polarity of said fifth crossing pulse.

21. A system comprising:
a source synchronous link including at least a first line and a second line;

a first circuit coupled to transmit on said source synchronous link; and a second circuit coupled to receive on said source synchronous link;

wherein said first circuit is configured to transmit a first transition for generating a first reflection on said first line and to transmit a subsequent first crossing pulse on said first line, and wherein said first circuit is configured to transmit a second crossing pulse on said second line, said second crossing pulse transmitted concurrent with said first crossing pulse and having an opposite polarity of said first crossing pulse, and wherein said second circuit is configured to verify that signals on said first line and said second line are correctly received; and wherein said first circuit is further configured to transmit a second transition for generating a second reflection on said first line subsequent to transmitting said first crossing pulse, and wherein said first circuit is further configured to transmit a third crossing pulse on said first line, wherein a first number of data transfers on said first line between said first transition and said first crossing pulse differs from a second number of data transfers on said first line between said second transition and said third crossing pulse.

* * * * *